(12) United States Patent
De Boer et al.

(10) Patent No.: US 7,362,690 B2
(45) Date of Patent: Apr. 22, 2008

(54) LASER DRIVER/METHOD FOR GENERATING A LASER DRIVE SIGNAL

(75) Inventors: Bart Michiel De Boer, Eindhoven (NL); Johannes Aldegonda Theodora Maria Van Den Homberg, Eindhoven (NL); Albert Hendrik Jan Immink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 177 days.

(21) Appl. No.: 10/560,678

(22) PCT Filed: Jun. 16, 2004

(86) PCT No.: PCT/IB2004/050916

§ 371 (c)(1),
(2), (4) Date: Dec. 14, 2005

(87) PCT Pub. No.: WO2004/112015

PCT Pub. Date: Dec. 23, 2004

(65) Prior Publication Data

US 2007/0096963 A1    May 3, 2007

(30) Foreign Application Priority Data

Jun. 19, 2003 (EP) .................................. 03076914

(51) Int. Cl.
*G11B 7/00* (2006.01)
(52) U.S. Cl. .................... 369/116; 341/144; 369/53.26; 369/59.12; 372/38.02; 372/38.07
(58) Field of Classification Search .................. 369/116
See application file for complete search history.

(56) References Cited

U.S. PATENT DOCUMENTS 5,197,059 A * 3/1993 Minami et al. ............. 369/116

(Continued)

FOREIGN PATENT DOCUMENTS

EP         1058246 A2    6/2000

(Continued)

*Primary Examiner*—Khai M. Nguyen
(74) *Attorney, Agent, or Firm*—Michael E. Belk

(57) ABSTRACT

A driver for driving a light generator for generating light, comprising a digitalto-analog converter (DAC) having a data input, a data output for generating an analog signal, a first multiplexer (MUX1) for cyclic selection of a number of data levels corresponding to desired intensity levels of the light and for coupling the data levels to the data input; a de multiplexer (DE-MUX) synchronized with the first multiplexer (MUX1) for de-multiplexing the analog signal into a set of analog signals; memory means for temporarily storing the set of analog signals; and a second multiplexer (MUX2) for selection of the stored set of analog signals and for generating a drive signal (IL) for the light generator. The memory means is preferably implemented by a set of capacitors (C1-C8). Usually, for instance in an optical disc drive, the light generator is implemented by a laser ($L_s$). In this situation the data input of the digital-to-analog converter comprises a threshold data input part; a delta data input part; a threshold gain reference input associated with the threshold data input part; and a delta gain reference input associated with the delta data input part. So in fact the DAC is split into two parts (DAC1 and DAC2) for separate threshold power and delta power control of the laser (LS).

6 Claims, 3 Drawing Sheets

U.S. PATENT DOCUMENTS 5,237,558 A * 8/1993 Horikiri et al. .......... 369/53.26
5,640,381 A * 6/1997 Call et al. ................ 369/47.52
6,359,847 B1   3/2002 Shimizu
7,057,900 B2   6/2006 Roscoe et al.
7,057,990 B1 * 6/2006 Seo ........................ 369/47.52
7,061,951 B2 * 6/2006 Fairgrieve et al. ....... 372/38.02
7,161,882 B2 * 1/2007 Lehr et al. ............... 369/47.51
7,200,091 B2 * 4/2007 Masui et al. ............. 369/59.11

FOREIGN PATENT DOCUMENTS

EP         1304686 A2    4/2003

* cited by examiner

LASER DRIVER/METHOD FOR GENERATING A LASER DRIVE SIGNAL

This application is a 371 of PCT/IB04/50916, which has an international filing date of Jun. 16, 2004, designating the United States of America, and claims the benefit of European patent Application 03076914.5 filed Jun. 19, 2003.

FIELD OF THE INVENTION

The invention relates in general to a driver for driving a light generator, and more particularly to a laser driver for driving a laser. The invention also relates to an optical recording apparatus comprising a laser driver for writing information into an optical storage medium, more particularly but not necessarily exclusively an optical storage disc. Further, the invention relates to a method for driving a light generator, such as a laser. Hereinafter, the present invention will be mainly explained for the case of an optical recording apparatus having a laser and a laser driver. It is however emphasized that the invention is not to be regarded to be limited to an optical recording apparatus or to the use of an optical disc. An optical recording apparatus is often indicated as "optical disc drive".

BACKGROUND OF THE INVENTION

As is commonly known, an optical storage disc comprises at least one track, either in the form of a continuous spiral or in the form of multiple concentric circles, of storage space where information may be stored in the form of a data pattern. Optical discs may be read-only type, where information is recorded during manufacturing, which information can only be read by a user. The optical storage disc may also be a writable type, where information may be stored by a user. For writing information in the storage space of a writable optical storage disc, an optical disc drive comprises, on the one hand, rotating means for receiving and rotating an optical disc, and on the other hand light generating means for generating an optical beam, typically a laser beam, and for scanning the storage track with said laser beam. Since the technology of optical discs in general, and the way in which information can be stored in an optical disc, is commonly known, it is not necessary here to describe this technology in great detail. For understanding the present invention, it is sufficient to mention that the laser beam is modulated such as to cause a pattern of locations where properties of the disc material have changed, such pattern corresponding to coded information. Generally, the laser drive signal is a digital signal. During recording an optical disc the laser driver controls the laser by a drive current. This drive current, and consequently the light emitted by the laser, follows a desired pattern. In fact the drive current is modulated in amplitude as a function of time. For various reasons, e.g. because of a data erase function, the drive current may (but not necessarily) have more than two values. The way in which the laser is controlled for generating the desired pattern of light pulses is generally termed a write-strategy and is generally performed by a Write Strategy Generator.

Generally a laser starts to radiate light if the electrical power supplied to it is above a certain threshold. The supplied power corresponding to this threshold will be further denoted as "threshold power". In order to be able to write, read, or erase information to/from the optical disk the laser needs a certain amount of power on top of the threshold power. This is generally denoted as "delta power". The power supplied to the laser is controlled by said Write Strategy Generator.

The threshold of a laser is not always the same. It may shift due to a change in temperature. Also by ageing of the laser the threshold can change. Also the amount of delta power may shift due to various causes. Therefore it is generally needed to control the threshold power and the delta power of the laser. Preferably this is performed automatically, e.g. by applying one or more feedback loops.

The Write Strategy Generator delivers data levels which drive the laser via a digital-to-analog converter. Since the data levels must be relatively accurate quite a lot of bits (e.g. 16 bits) are used. In the case of a laser driver the digital-to-analog converter is preferably divided in two parts, further to be denoted by a threshold part and a delta part. Then also the data levels are divided in two parts (e.g. two parts of 8 bits). The gains of the threshold and delta parts are controlled by a so-called threshold reference current and a delta reference current, respectively. This enables the separate control of the threshold power and the delta power of the laser.

SUMMARY OF THE INVENTION

It is an object of the invention to reduce the power consumption of a driver for a light generator, in particularly to reduce the power consumption of a laser driver for a laser.

To achieve the object of the invention a driver for driving a light generator for generating light, comprising a digital-to-analog converter having a data input, a data output for generating an analog signal, is characterized in that the driver further comprises a first multiplexer for cyclic selection of a number of data levels corresponding to desired intensity levels of the light and for coupling the data levels to the data input; a de-multiplexer synchronized with the first multiplexer for de-multiplexing the analog signal into a set of analog signals; memory means for temporarily storing the set of analog signals; and a second multiplexer for selection of the stored set of analog signals and for generating a drive signal for the light generator. The memory means is preferably implemented by a set of capacitors since this is a very simple solution having the additional advantage of a further lowering of the power consumption. This is especially important for portable applications. In the case that the driver is a laser driver for driving a laser, an embodiment of the invention is further characterized in that the data input of the digital-to-analog converter comprises a threshold data input part; a delta data input part; a threshold gain reference input associated with the threshold data input part; and a delta gain reference input associated with the delta data input part. By the addition of the first multiplexer and the de-multiplexer the clock frequency for the digital-to-analog-converter can be chosen different from the clock frequency of the second multiplexer (the second multiplexer is the only multiplexer used in prior art drivers). The second multiplexer is driven (like in the prior art) by the Write Strategy Generator which has a very high clock frequency, e.g. 500 Mhz. The capacitors hold the needed data levels which are coupled to the laser by the second multiplexer controlled by the Write Strategy Generator. The refreshing of the data levels on the capacitors can be performed with a relative low frequency. Also the gains of the threshold and delta parts need not be adapted with a high frequency. Therefore the digital-to-analog-converter can use a relatively low clock frequency, e.g. 1 Mhz. (Instead of e.g. 500 Mhz in the prior art.) As a consequence the power consumption of the the digital-to-analog-converter is decreased significantly.

The invention will be described in more detail with reference to the accompanying drawings, in which.

In these figures parts or elements having like functions or purposes bear the same reference symbols.

Figure 1:
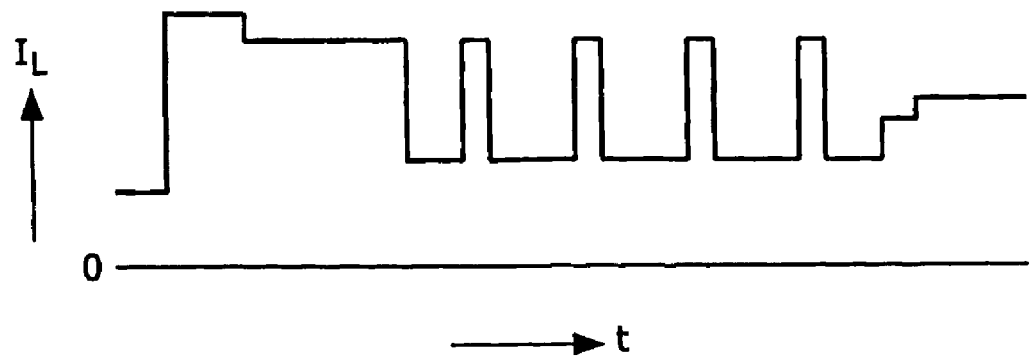
FIG. 1 shows a write strategy signal diagram of a possible drive current for a laser.

FIG. 1. shows a write strategy signal diagram of a possible drive current $I_L$ for a laser. As indicated, the drive current $I_L$ has a few levels, which however must be mutually very accurate.

Figure 2:
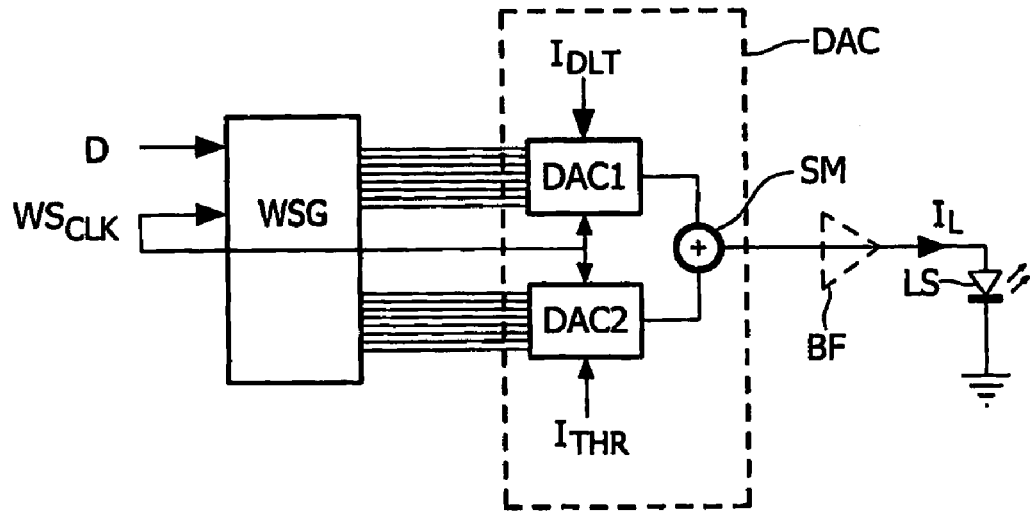
FIG. 2 shows a known laser driver.

FIG. 2 shows a known laser driver which comprises a digital-to-analog converter DAC, a write strategy generator WSG, a buffer BF, and a laser LS. The buffer BF is optional. The need for it depends on the actual implementation of the DAC. It can for instance be an inverting buffer. In FIG. 2 the DAC is divided into two parts: DAC1 and DAC2 so that threshold power control and delta power control can be treated separately. Threshold current reference $I_{THR}$ and delta current reference $I_{DLT}$ control the gains of DAC2 and DAC1, respectively. Optional a somewhat simpler implementation can be chosen by leaving out the threshold control so that DAC2 is not needed, at the cost of a somewhat less accurate control of the laser current $I_L$.

In this example, the data D is encoded by the WSG to generate 2 sets of 8 bit data levels which are coupled to DAC1 and DAC2. DAC1 and DAC2 convert the data levels into analog signals which are summed by a summator SM to form the laser drive current $I_L$. Since DAC1 and DAC2 use the same clock signal $WS_{CLK}$ as the WSG which has a very high frequency, they have a relatively high power consumption.

Figure 3:
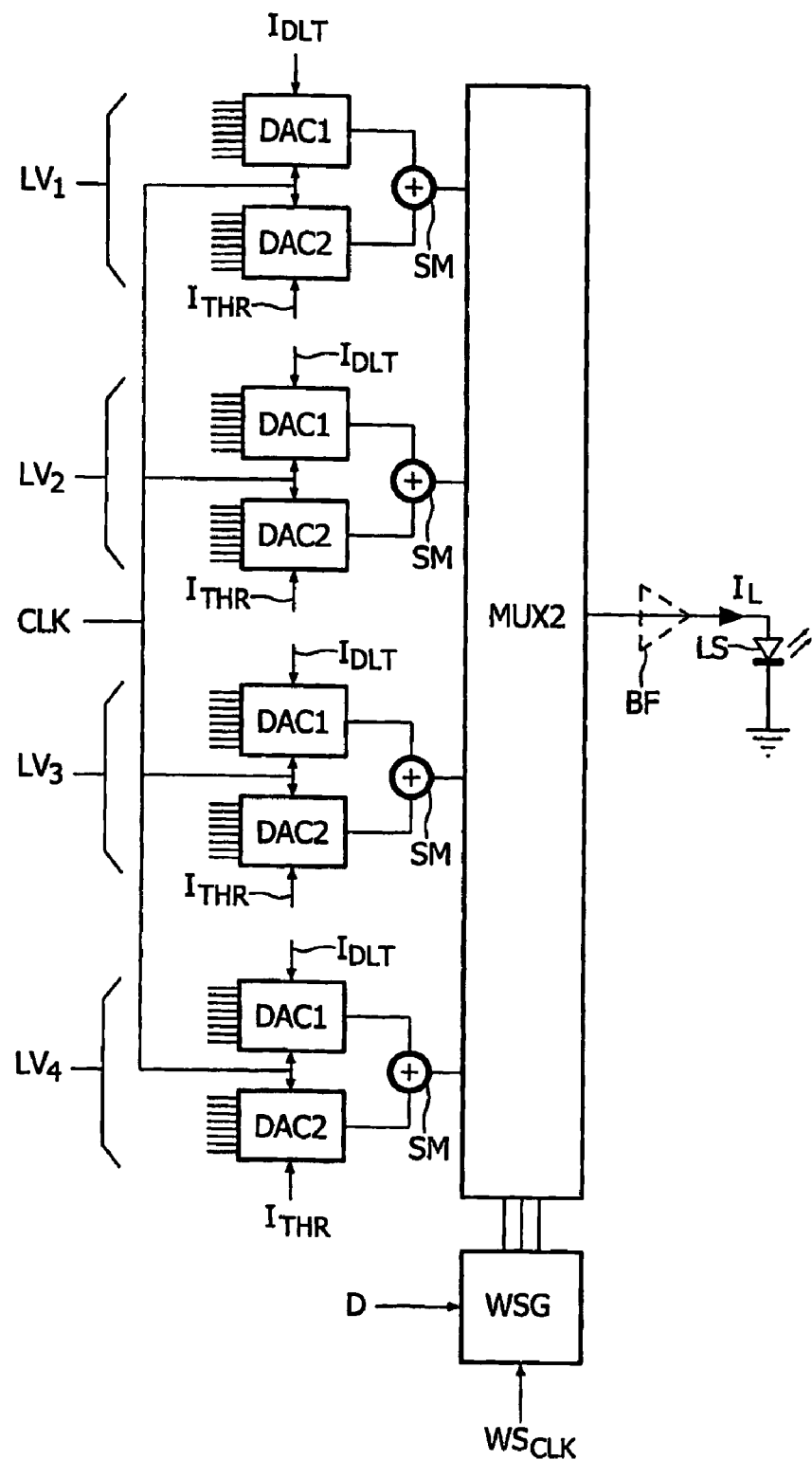
FIG. 3 shows another known laser driver.

FIG. 3 shows another known laser driver. In contrast with the laser driver shown in FIG. 2, it comprises 4 sets of DAC1 and DAC2, and additional a multiplexer. The multiplexer is further denoted as MUX2 because it has the same function as the second multiplexer MUX2 shown in FIG. 4, which will be discussed later.

This known laser driver is an improvement to the one shown in FIG. 2, regarding the power consumption. In this laser driver use is made of the knowledge that although the levels (see FIG. 1) for the drive current $I_L$ must be fixed very accurately, there are only needed a few levels. Therefore the 16 bit (two times 8 bit) connections between the WSG and DAC1 and DAC2, in FIG. 2, are only needed for the sake of defining a high accuracy of the data levels, and thus not for generating $2^{16}$ data levels.

For this reason in FIG. 2 it is chosen to not drive the DAC1 and DAC2 from the WSG, but to set fixed input levels to the DAC1 and DAC2. To generate several levels for the drive current $I_L$, more than one set of DAC1 and DAC2 are used. In this example four 16 bit levels $LV_1$-$LV_4$ are chosen. Therefore 4 sets of DAC1 and DAC2 are used which are selected by the MUX2 under control of the WSG. Now only MUX2 is driven by the WSG and therefore operates with a very high frequency. The sets of DAC1 and DAC2 may operate with a much lower clock frequency. As a consequence, although more than 1 set of DAC1 and DAC2 is needed, the power consumption of this laser driver is lower compared to the one shown in FIG. 2.

Figure 4:
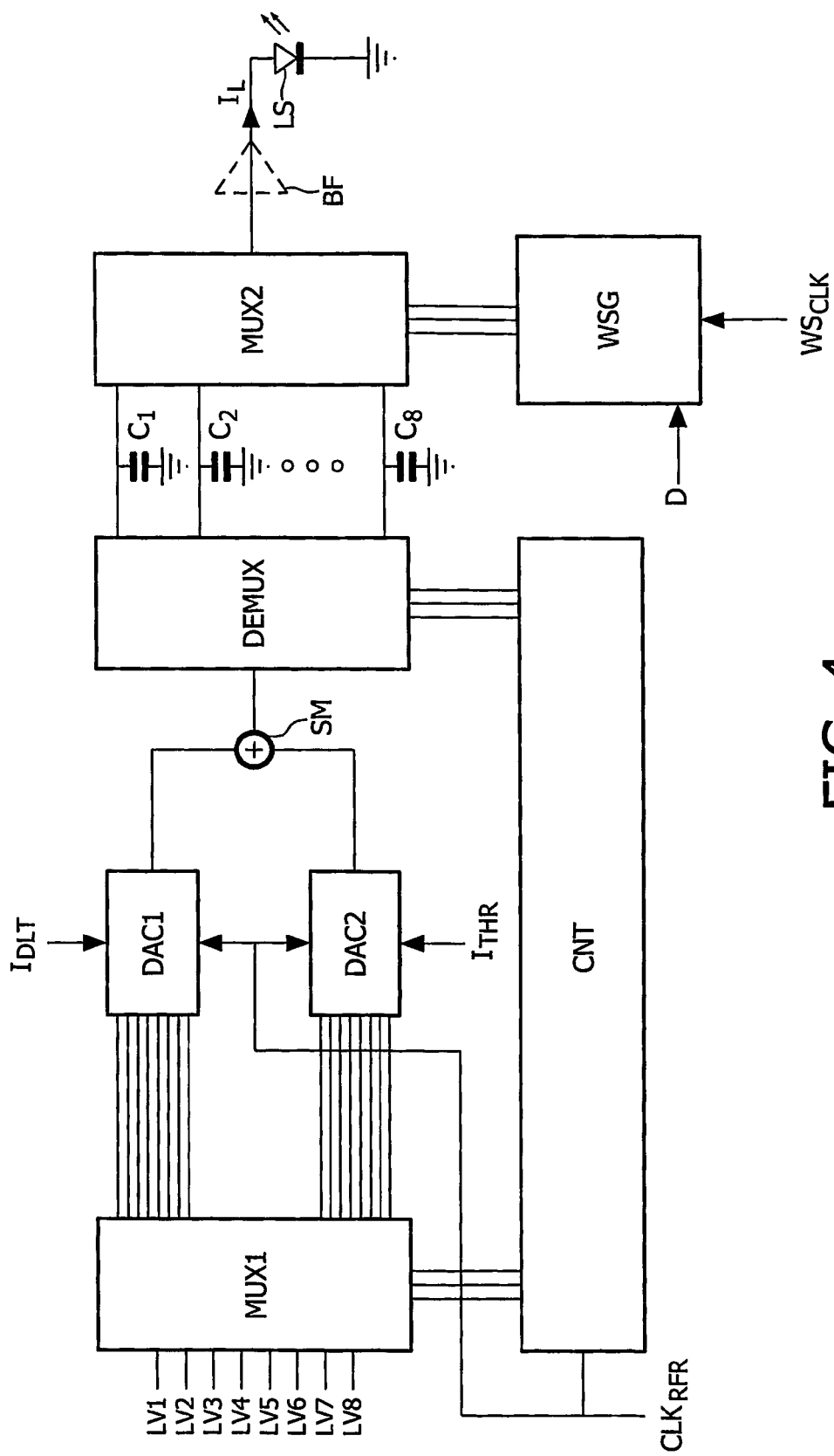
FIG. 4 shows an embodiment of the inventive laser driver.

FIG. 4 shows an embodiment of the inventive laser driver. In contrast with the laser driver shown in FIG. 3, it again only needs 1 set of DAC1 and DAC2, like the laser driver shown in FIG. 2. By way of example $LV_1$ comprises a fixed level of 16 bits. The 16 bits are divided into two parts of 8 bits intended for DAC1 and DAC2, respectively. The same holds for $LV_1$-$LV_8$. Under control of a (in this example) 3 bit cyclic counter CNT, all the 16 bit levels LV1-LV8 are consecutively coupled to the data inputs of the DAC1 and DAC2. A de-multiplexer DE-MUX de-multiplexes the analog signal formed after the summator SM into a set of (in this example 8) "DC" levels which are stored in a memory which is implemented by the capacitors $C_1$-$C_8$. The DE-MUX is controlled by the counter CNT to operate in synchronization with the MUX1. A second multiplexer MUX2 multiplexes the set of DC-levels under control of the WSG to form the laser drive current $I_L$.

In fact the inventive laser drive combines the advantages of both the known laser drivers shown in FIGS. 2 and 3, without the disadvantages. Thus the power consumption is further reduced.

The invention claimed is:

1. A driver for driving a light generator for generating light, comprising a digital-to-analog converter (DAC) having a data input, a data output for generating an analog signal, characterized in that the driver further comprises a first multiplexer (MUX1) for cyclic selection of a number of data levels corresponding to desired intensity levels of the light and for coupling the data levels to the data input; a de-multiplexer (DE-MUX) synchronized with the first multiplexer (MUX1) for de-multiplexing the analog signal into a set of analog signals; memory means for temporarily storing the set of analog signals; and a second multiplexer (MUX2) for selection of the stored set of analog signals and for generating a drive signal ($I_L$) for the light generator.

2. A driver according to claim 1, characterized in that the memory means is implemented by a set of capacitors (C1-C8).

3. A driver according to claim 1, characterized in that the light generator is implemented by a laser ($L_S$).

4. A driver according to claim 3, characterized in that the data input of the digital-to-analog converter comprises a threshold data input part; a delta data input part; a threshold gain reference input associated with the threshold data input part; and a delta gain reference input associated with the delta data input part.

5. An optical recording apparatus comprising a driver as claimed in claim 1.

6. A method for driving a light generator for generating light, comprising the steps of:
cyclic multiplexing a number of data levels corresponding to desired intensity levels of the light,
converting the cyclic multiplexed data level into an analog signal,
de-multiplexing the analog signal into a set of analog signals in synchronization with the multiplexing of the number of data levels,
temporarily storing the set of analog signals, and
selecting the stored set of analog signals for generating a drive signal for the light generator.

* * * * *